United States Patent
Lee et al.

(10) Patent No.: US 9,436,657 B2
(45) Date of Patent: Sep. 6, 2016

(54) COMPUTING DEVICE AND METHOD FOR ANALYZING ACQUISITION VALUES

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Chung-I Lee, New Taipei (TW); Yi-Guo Wang, Shenzhen (CN); Kuan-Chiao Peng, New Taipei (TW); Jian Huang, Shenzhen (CN); Yi-Ming Lu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 893 days.

(21) Appl. No.: 13/753,336

(22) Filed: Jan. 29, 2013

(65) Prior Publication Data

US 2013/0226478 A1     Aug. 29, 2013

(30) Foreign Application Priority Data

Feb. 29, 2012  (CN) .......................... 2012 1 0049186

(51) Int. Cl.
| | |
|---|---|
| G01D 9/00 | (2006.01) |
| G06F 17/00 | (2006.01) |
| G01R 31/00 | (2006.01) |
| G01K 1/02 | (2006.01) |

(52) U.S. Cl.
CPC ............... *G06F 17/00* (2013.01); *G01D 9/005* (2013.01); *G01K 1/022* (2013.01); *G01R 31/00* (2013.01)

(58) Field of Classification Search
CPC ...................................................... G01D 9/005
USPC .......................................................... 702/58
See application file for complete search history.

(56) References Cited

U.S. PATENT DOCUMENTS 4,134,149 A * 1/1979 Nord ...................... G01R 13/34
345/168
7,069,185 B1 * 6/2006 Wilson ................. G05B 19/058
700/26

FOREIGN PATENT DOCUMENTS

| | | |
|---|---|---|
| CN | 1412646 | 4/2003 |
| CN | 1752942 | 3/2006 |
| TW | I258075 B | 7/2006 |
| TW | 201011540 A | 3/2010 |

* cited by examiner

*Primary Examiner* — Bryan Bui
(74) *Attorney, Agent, or Firm* — Zhigang Ma

(57) ABSTRACT

In a method for analyzing acquisition values of an electronic device using a computing device, the computing device receives an acquisition value of the electronic device acquired by a data acquisition device. If the acquisition value is discrete data and the acquisition value is different from a previous acquisition value of the electronic device, the acquisition value is stored into a storage system. If the acquisition value is the continuous data and a first state corresponding to the acquisition value is different from a second state corresponding to a previous acquisition value of the electronic device, the acquisition value is stored into the storage system.

15 Claims, 3 Drawing Sheets

US 9,436,657 B2

COMPUTING DEVICE AND METHOD FOR ANALYZING ACQUISITION VALUES

BACKGROUND

1. Technical Field

The embodiments of the present disclosure relate to data processing systems and methods, and particularly to a computing device and method for analyzing acquisition values of an electronic device.

2. Description of Related Art

To ensure an electronic device (e.g., a server) is running properly, a data acquisition device (e.g., a temperature sensor or a voltmeter) may be used to acquire acquisition values (e.g., temperatures or voltages) of the electronic device. The amount of data thereby acquired may be so large that it is difficult to store the acquired data in limited storage space.

SUMMARY OF THE INVENTION

A method for analyzing acquisition value of an electronic device executed by a processor of a computing device, the method includes: receiving an acquisition value of the electronic device acquired by a data acquisition device; determining whether the acquisition value is discrete data or continuous data determining whether the acquisition value is different from a first previous acquisition value of the electronic device acquired by the data acquisition device in response that the acquisition value is the discrete data, and storing the acquisition value into a storage system of the computing device in response that the acquisition value is different from the first previous acquisition value of the electronic device; and determining whether a first state of the electronic device corresponding to the acquisition value is different from a second state of the electronic device corresponding to a second previous acquisition value of the electronic device, in response that the acquisition value is the continuous data, and storing the acquisition value into the storage system in response that the first state of the electronic device is different from the second state of the electronic device.

A computing device includes: a storage system; at least one processor; and a data analysis system includes one or more programs that are stored in the storage system and executed by the at least one processor, the one or more a instructions to receive an acquisition value of an electronic device acquired by a data acquisition device; determine whether the acquisition value is discrete data or continuous data; determine whether the acquisition value is different from a first previous acquisition value of the electronic device acquired by the data acquisition device in response that the acquisition value is the discrete data, and store the acquisition value into the storage system in response that the acquisition value is different from the first previous acquisition value of the electronic device; and determine whether a first state of the electronic device corresponding to the acquisition value is different from a second state of the electronic device corresponding to a second previous acquisition value of the electronic device in response that the acquisition value is the continuous data, and store the acquisition value into the storage system in response that the first state of the electronic device is different from the second state of the electronic device.

A non-transitory computer-readable storage medium storing a set of instructions, the set of instructions capable of being executed by a processor of a computing device to implement a method for analyzing acquisition value of an electronic device, the method including: receiving an acquisition value of the electronic device acquired by a data acquisition device; determining whether the acquisition value is discrete data or continuous data; determining whether the acquisition value is different from a first previous acquisition value of the electronic device acquired by the data acquisition device in response that the acquisition value is the discrete data, and storing the acquisition value into a storage system of the computing device in response that the acquisition value is different from the first previous acquisition value of the electronic device; and determining whether a first state of the electronic device corresponding to the acquisition value is different from a second state of the electronic device corresponding to a second previous acquisition value of the electronic device, in response that the acquisition value is the continuous data, and storing the acquisition value into the storage system in response that the first state of the electronic device is different from the second state of the electronic device.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
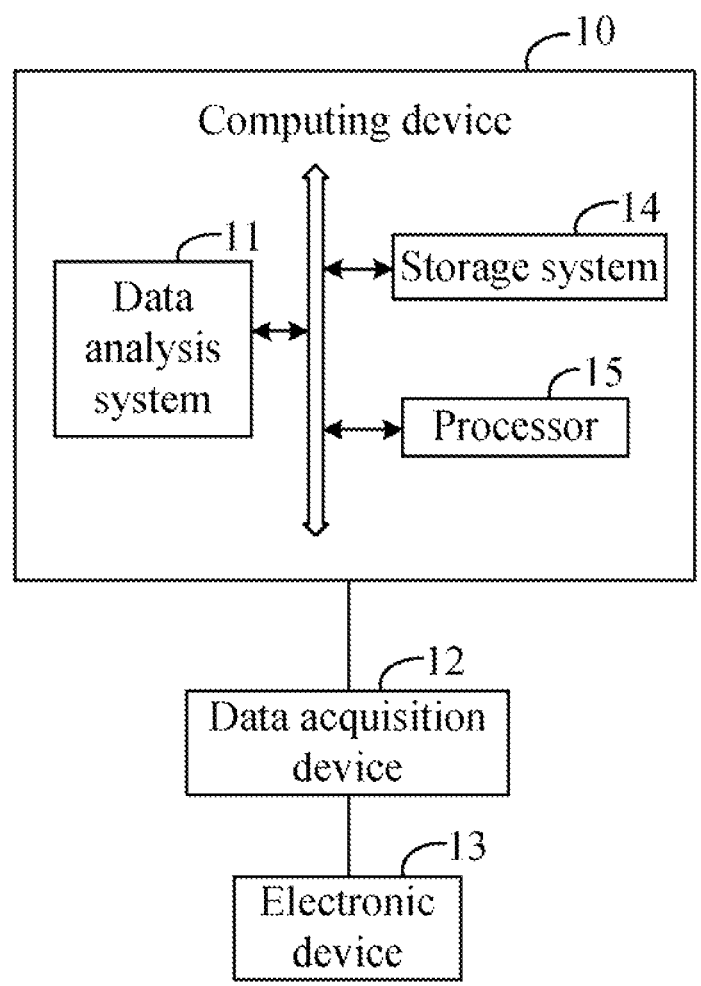
FIG. 1 is a block diagram of one embodiment of a computing device including a data analysis system.

FIG. 1 is a block diagram of one embodiment of a computing device 10. In the embodiment, the computing device 10 includes a data analysis system 11. The computing device 10 is connected to a data acquisition device 12 e.g., a temperature sensor or a voltmeter). The data acquisition device 12 periodically acquires acquisition values (e.g., temperatures or voltages) of an electronic device 13. The acquisition values may be discrete data or continuous data. The discrete data include a finite number of possible values (e.g., 0 and 1). The continuous data include an infinite number of possible values. The data analysis system 11 is provided to analyze the acquired acquisition values, and recognize and delete unnecessary values from, the acquired acquisition values. The computing device 10 further includes a storage system 14 and at least one processor 15. The storage system 14 may be a dedicated memory, such as an erasable programmable read only memory (EPROM), a hard disk driver (HDD), or flash memory. In some embodiments, the storage system 14 may also be an external storage device, such as an external hard disk, a storage card, or other data storage medium.

Figure 2:
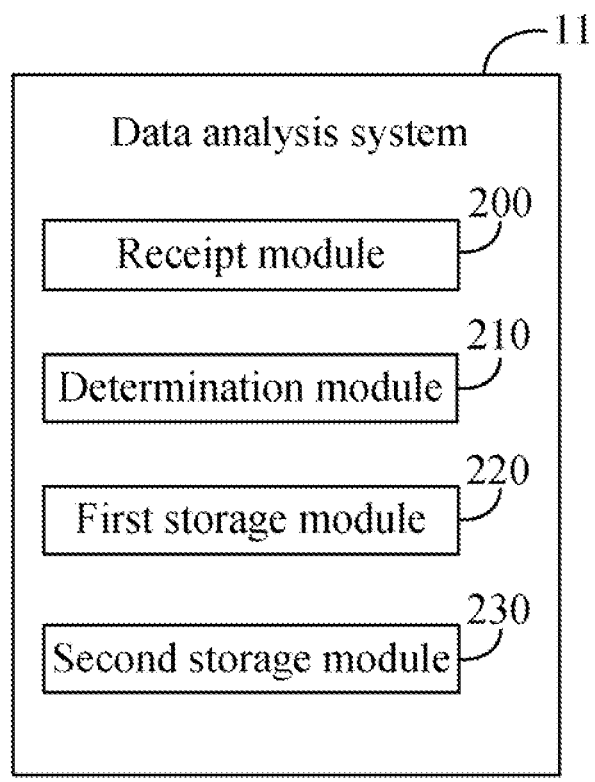
FIG. 2 is a block diagram of one embodiment of function modules of the data analysis system in FIG. 1.

FIG. 2 is a block diagram of one embodiment of function modules of the data analysis system 11 in FIG. 1. The data analysis system 11 includes a receipt module 200, a determination module 210, a first storage module 220, and a second storage module 230. The modules 200, 210, 220, and 230 may comprise computerized code in the form of one or more programs that are stored in the storage system 14. The computerized code includes instructions that are executed by the at least one processor 15, to provide the aforementioned functions of the data analysis system 11. A detailed description of the functions of the modules 200-230 is given below and in reference to FIG. 3.

In the present disclosure, the word "module," as used herein, refers to logic embodied in hardware or firmware, or to a collection of software instructions, written in a program language. In one embodiment, the program language may be Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of a non-transitory computer-readable medium include CDs, DVDs, flash memory, and hard disk drives.

Figure 3:
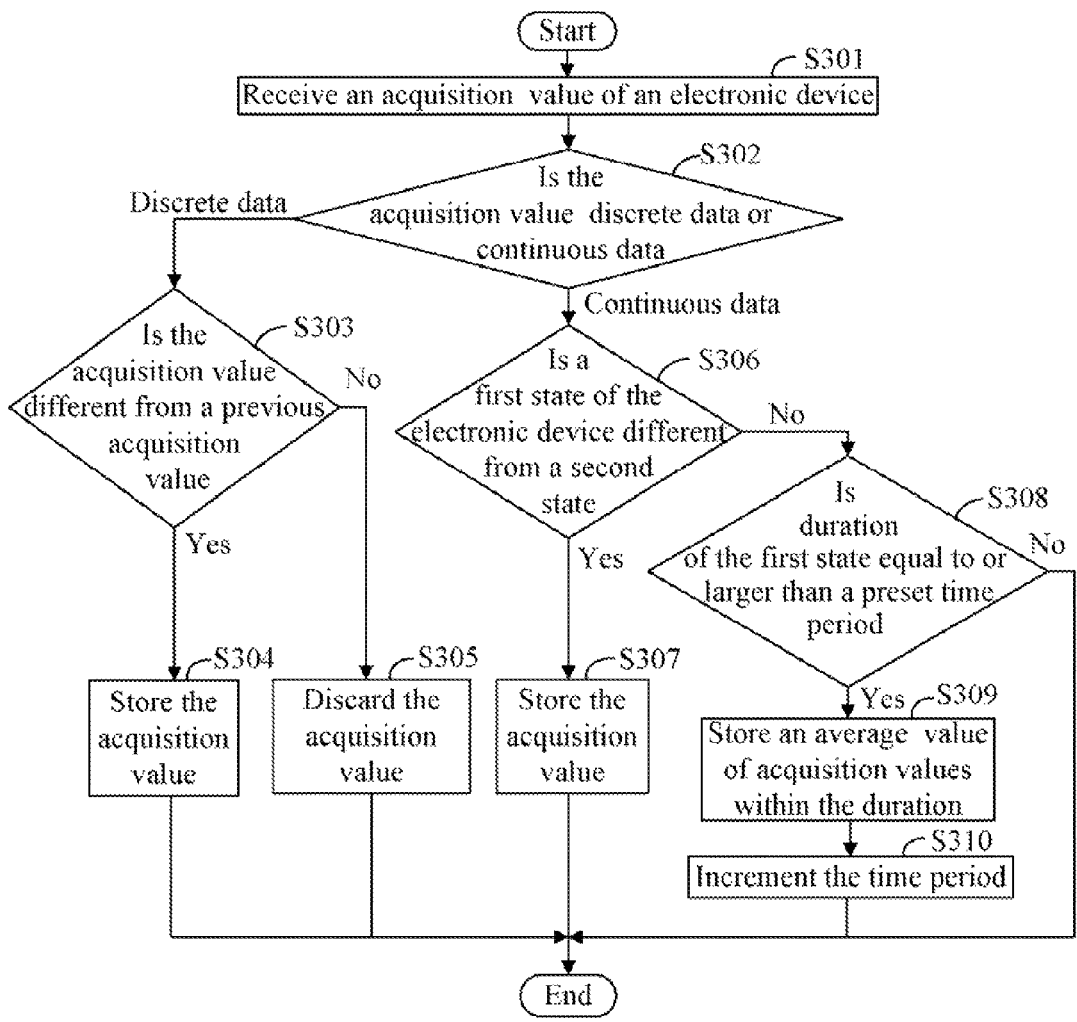
FIG. 3 is a flowchart of one embodiment of a method for analyzing acquisition values of an electronic device using the computing device in FIG. 1.

FIG. 3 is a flowchart of one embodiment of a method for analyzing acquisition values of the electronic device 13 using the computing device 10 in FIG. 1. Depending on the embodiment, additional steps may be added, others removed, and the ordering of the steps may be changed.

In step S301, the data acquisition device 12 acquires an acquisition value (e.g., a temperature or a voltage) of the electronic device 13, and sends the acquisition value to the receipt module 200. In this embodiment, the data acquisition device 12 is a temperature sensor used to detect temperatures of a CPU of the electronic device 13. The receipt module 200 receives the acquisition value sent by the data acquisition device 12.

In step S302, the determination module 210 determines a data type of the acquisition value. The acquisition value may be discrete data or continuous data. As mentioned above, discrete data include a finite number of possible values (e.g., 0 and 1). Continuous data include an infinite number of possible values.

If the data type of the acquisition value is discrete data in step S303, the first storage module 220 determines whether the acquisition value is different from a previous acquisition value of the electronic device 13 acquired by the data acquisition device 12.

If the acquisition value of the discrete data is different from the previous acquisition value of the electronic device 13, in step S304, the first storage module 220 determines that the acquisition value is a necessary value and stores the acquisition value into the storage system 14. The first storage module 220 may further determine a state of the electronic device 13 corresponding to the acquisition value, and stores the state of the electronic device 13 into the storage system 14. In this embodiment, each value of the discrete data corresponds to a state of the electronic device 13. For example, if the acquisition value is a digital "1," the electronic device 13 is in a power-on state. If the acquisition value is a digital "0," the electronic device 13 is in a power-off state.

If the acquisition value is the same as the previous acquisition value of the electronic device 13, in step S305, the first storage module 220 determines that the acquisition value is unnecessary and discards the acquisition value.

If the data type of the acquisition data is the continuous data type, in step S306, the second storage module 230 determines a first state of the electronic device 13 corresponding to the acquisition value and determines a second state of the electronic device 13 corresponding to a previous acquisition value of the electronic device 13, and determines whether the first state of the electronic device 13 is different from the second state of the electronic device 13. In this embodiment, several value ranges for the continuous data are predefined. Each value range of the continuous data corresponds to a state of the electronic device 13. If the acquisition value falls within a particular value range, the electronic device 13 is determined to be in the state corresponding to that value range. For example, according to different temperatures of a CPU of the electronic device 13 then a safe state, a critical state, and a dangerous state are defined in relation to the electronic device 13. If the temperature of the CPU of the electronic device 13 (denoted as "t") falls within a first value range (e.g., less than 75° C.), the electronic device 13 is in the safe state. If the temperature of the CPU of the electronic device 13 falls within a second value range between 75° C. and 85° C.), the electronic device 13 is in the critical state. If the temperature of the CPU of the electronic device 13 falls within, a third value range (e.g., greater than 85° C.), the electronic device 13 is in the dangerous state.

If the first state of the electronic device 13 is different from the second state of the electronic device 13, in step S307, the second storage module 230 determines that the acquisition value of the continuous data is a necessary value and stores the acquisition value into the storage system 14. In one embodiment, if the first state of the electronic device 13 is determined to be different from the second state of the electronic device 13, the second storage module 230 also stores the first state of the electronic device 13 into the storage system 14.

Otherwise, if the first state of the electronic device 13 is determined to be the same as the second state of the electronic device 13, in step S308, the second storage module 230 calculates a duration of the first state, and determines whether the duration is equal to or greater than a preset time period. In an embodiment, if the first state of the electronic device 13 is the same as the second state of the electronic device 13, the process simply ends.

If the duration of the first state is equal to or greater than the preset time period, in step S309, the second storage module 230 calculates an average value of all acquisition values of the electronic device 13 within the duration, and stores the average value into the storage system 14. For example, the preset time period is three minutes. Three different temperatures, namely 50° C., 60° C., and 70° C., of the CPU of the electronic device 13 are acquired by the data acquisition device 12 within the three minutes. Therefore, an average temperature of 60° C. (i.e., 50° C.+60° C.+70° C.)/3) is obtained.

In step S310, the second storage module 230 increments the time period. In one embodiment, the time period is doubled. For example, the time period is initially three minutes. If the duration of one particular state is equal to or greater than the preset time period, the time period is incremented to six minutes. If the duration time of one particular state is less than the preset time period, this step ends.

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. A method for analyzing acquisition value of an electronic device executed by a processor of a computing device, the method comprising:
   receiving an acquisition value of the electronic device acquired by a data acquisition device;

determining whether the acquisition value is discrete data or continuous data;

determining whether the acquisition value is different from a first previous acquisition value of the electronic device acquired by the data acquisition device in response that the acquisition value is the discrete data, and storing the acquisition value into a storage system of the computing device in response that the acquisition value is different from the first previous acquisition value of the electronic device; and determining whether a first state of the electronic device corresponding to the acquisition value is different from a second state of the electronic device corresponding to a second previous acquisition value of the electronic device, in response that the acquisition value is the continuous data, and storing the acquisition value into the storage system in response that the first state of the electronic device is different from the second state of the electronic device.

2. The method of claim 1, further comprising:

calculating duration of the first state in response that the first state of the electronic device is the same as the second state of the electronic device, and determining whether the duration is equal to or greater than a preset time period; and calculating an average value of all acquisition values of the electronic device within the duration in response that the duration is equal to or greater than the preset time period, and storing the average value into the storage system.

3. The method of claim 2, further comprising:

incrementing the time period in response that the duration is equal to or greater than the time period.

4. The method of claim 3, wherein the time period is doubled.

5. The method of claim 1, further comprising:

storing the first state of the electronic device into the storage system, in response that the acquisition value is the continuous data and the first state of the electronic device is different from the second state of the electronic device.

6. A computing device, comprising:

a storage system;

at least one processor; and a data analysis system comprising one or more programs that are stored in the storage system and executed by the at least one processor, the one or more programs comprising instructions to:

receive an acquisition value of an electronic device acquired by a data acquisition device;

determine whether the acquisition value is discrete data or continuous data;

determine whether the acquisition value is different from a first previous acquisition value of the electronic device acquired by the data acquisition device in response that the acquisition value is the discrete data, and store the acquisition value into the storage system in response that the acquisition value is different from the first previous acquisition value of the electronic device; and determine whether a first state of the electronic device corresponding to the acquisition value is different from a second state of the electronic device corresponding to a second previous acquisition value of the electronic device, in response that the acquisition value is the continuous data, and store the acquisition value into the storage system in response that the first state of the electronic device is different from the second state of the electronic device.

7. The computing device of claim 6, wherein the one or more programs further comprise instructions to:

calculate a duration of the first state in response that the first state of the electronic device is same as the second state of the electronic device, and determine whether the duration is equal to or greater than a preset time period; and calculate an average of all acquisition values of the electronic device within the duration in response that the duration is equal to or greater than the preset time period, and store the average value into the storage system.

8. The computing device of claim 7, wherein the one or more programs further comprise instructions to:

increment the time period in response that the duration is equal to or greater than the time period.

9. The computing device of claim 8, wherein the time period is doubled.

10. The computing device of claim 6, wherein the one or more programs further comprise instructions to:

store the first state of the electronic device into the storage system, in response that the acquisition value is the continuous data and the first state of the electronic device is different from the second state of the electronic device.

11. A non-transitory computer-readable storage medium storing a set of instructions, the set of instructions capable of being executed by a processor of a computing device to implement a method for analyzing acquisition value of an electronic device, the method comprising:

receiving an acquisition value of the electronic device acquired by a data acquisition device;

determining whether the acquisition value is discrete data or continuous data;

determining whether the acquisition value is different from a first previous acquisition value of the electronic device acquired by the data acquisition device in response that the acquisition value is the discrete data, and storing the acquisition value into a storage system of the computing device in response that the acquisition value is different from the first previous acquisition value of the electronic device; and determining whether a first state of the electronic device corresponding to the acquisition value is different from a second state of the electronic device corresponding to a second previous acquisition value of the electronic device, in response that the acquisition value is the continuous data, and storing the acquisition value into the storage system in response that the first state of the electronic device is different from the second state of the electronic device.

12. The storage medium of claim 11, wherein the method further comprises:

calculating a duration of the first state in response that the first state of the electronic device is same as the second state of the electronic device, and determining whether the duration is equal to or greater than a preset time period; and calculating an average acquisition value of all acquisition values of the electronic device within the duration in response that the duration is equal to or greater than the preset time period, and storing the average value into the storage system.

13. The storage medium of claim 12, wherein the method further comprises:
  incrementing the time period in response that the duration is equal to or greater than the time period.

14. The storage medium of claim 13, wherein the time period is doubled.

15. The storage medium of claim 11, wherein the method further comprises:
  storing the first state of the electronic device into the storage system, in response that the acquisition value is the continuous data and the first state of the electronic device is different from the second state of the electronic device.

\* \* \* \* \*